(12) United States Patent
Theobald

(10) Patent No.: US 10,216,865 B1
(45) Date of Patent: Feb. 26, 2019

(54) MONITORING ONE OR MORE ARTICLES ON A SUPPORT SURFACE

(71) Applicant: Vecna Technologies, Inc., Cambridge, MA (US)

(72) Inventor: Daniel Theobald, Sommerville, MA (US)

(73) Assignee: VECNA ROBOTICS, INC., Cambridge, MA (US)

( * ) Notice: Subject to any disclaimer, the term of this patent is extended or adjusted under 35 U.S.C. 154(b) by 148 days.

(21) Appl. No.: 13/678,193

(22) Filed: Nov. 15, 2012

Related U.S. Application Data

(60) Provisional application No. 61/607,319, filed on Mar. 6, 2012.

(51) Int. Cl.
  *G06F 17/50* (2006.01)
(52) U.S. Cl.
  CPC .................................. *G06F 17/50* (2013.01)
(58) Field of Classification Search
  CPC ...... G06Q 10/08; G06Q 20/203; G01N 23/04; G01N 23/203; G06K 2209/09; G06K 9/3233; G06K 9/6814; G06K 9/746; G04F 17/50
  USPC ...................... 703/2; 705/22, 28; 318/568.11
  See application file for complete search history.

(56) References Cited

U.S. PATENT DOCUMENTS

| | | | |
|---|---|---|---|
| 3,785,669 A | 1/1974 | Doheny | |
| 6,194,860 B1 * | 2/2001 | Seelinger et al. | 318/587 |
| 6,370,222 B1 * | 4/2002 | Cornick, Jr. | G01V 5/0016 378/57 |
| 7,233,682 B2 * | 6/2007 | Levine | G06Q 50/32 378/57 |
| 7,415,613 B2 * | 8/2008 | Impson et al. | 713/176 |
| 7,422,149 B2 * | 9/2008 | Aptekar | G06Q 10/08 235/385 |
| 7,719,222 B2 | 5/2010 | Theobald | |
| 7,798,402 B2 * | 9/2010 | Bochicchio | 235/385 |
| 7,896,113 B1 | 3/2011 | Ramirez | |
| 7,927,063 B2 | 4/2011 | Keenan et al. | |
| 8,094,781 B1 * | 1/2012 | Safai et al. | 378/87 |
| 8,538,577 B2 * | 9/2013 | Bell et al. | 700/215 |
| 2002/0156645 A1 | 10/2002 | Hansen | |
| 2005/0131645 A1 | 6/2005 | Panopoulos | |
| 2008/0077511 A1 * | 3/2008 | Zimmerman | 705/28 |
| 2008/0089477 A1 * | 4/2008 | Eshed | G01N 23/04 378/57 |
| 2011/0071677 A1 | 3/2011 | Stilman | |
| 2013/0110281 A1 * | 5/2013 | Jones | G06Q 50/28 700/228 |

OTHER PUBLICATIONS

Yaman, H., Manufacturer's mixed pallet design problem, European Journal of Operational Research 186 (2008) 826-840.*

(Continued)

*Primary Examiner* — Brian S Cook

(57) ABSTRACT

Devices, systems and methods are provided for monitoring a plurality of articles that are arranged on a support surface according to an article arrangement modeled with a first processing device. One of the methods includes receiving image data generated from the modeled article arrangement. The image data is received by a second processing device, and is indicative of an image of the arranged articles on the support surface. The received image data is used to inspect the arranged articles.

8 Claims, 7 Drawing Sheets

(56) References Cited

OTHER PUBLICATIONS

AIDCO International: AIDCO robot palletizing for building mixed product pallets, May 12, 2009 https://www.youtube.com/watch?v=1khQAnGDCSo.*
James, R.J.W., Three Dimensional Container Packing for Drums and Pallets, University of Canterbury, New Zealand, 1999.*
Moura, A. "A Grasp Approach to the Container-Loading Problem." IEEE Intelligent Systems 20.4 (2005): 50-57.*
Terno, J., An Efficient Approach for the Multi-Pallet Loading Problem, Institute of Numerical Mathematics, Technical University Dresden Mommsenstr. 13, D-01062 Dresden, Germany Oct. 15, 1997.*
Schlenoff, C., Performance Evaluation of Intelligent Systems at the National Institute of Standards and Technology (NIST) ITEA Journal 2011; 32: 59-67.*
Whelan, P.F., Automated Packing Systems—A Systems Engineering Approach IEEE Transactions on Systems, Man, and Cybernetics—Part A: Systems and Humans, vol. 26, No. 5, Sep. 1996.*
Leonardo: Robotic Pallet Wrapper Operation Book, Model: Robospir Leonardo, Apr. 2005.*
Robopac, Stretch Wrapping Website, http://web.archive.org/web/201109032059/http://www.althika.ae/robopac.html.*
Hvilshoj, M., The Mobile Robot "Little Helper": Concepts, ideas and working principles, IEEE 2009.*
Garibotto, G., Industrial Exploitation of Computer Vision in Logistic Automation: Autonomous Control of an Intelligent Forklift Truck, Proceedings of the 1998 IEEE International Conference on Robotics & Automation Leuven, Belgium, May 1998.*
Kahn, Z., Robot Based Logistics System for Hospitals—Survey. In IDT Workshop on Interesting Results in Computer Science and Engineering, 2008.*
Baldassari, E., Vecna's QC Bot, https://www.youtube.com/watch?v=-gZdHNmX2KY Apr. 20, 2011.*
Wiki Archive Page dated Nov. 15, 2011: Battlefield Extraction—Assist Robot.*
Overview BEAR Robot dated 2010 https://www.youtube.com/watch?v=8rdRxV-qn3w.*
Episode 2 BEAR Robot dated 2009 https://www.youtube.com/watch?v=0RuVidE73Y8.*
Episode 1 BEAR Robot dated 2009 https://www.youtube.com/watch?v=irvDKCszJxk.*
Rosen, J., Surgical Robotics: Systems Applications and Visions, Springer Science & Business Media, 2011.*
Gilbert, G.R., United States Department of Defense Research in Robotic Unmanned Systems for Combat Casualty Care, 2010.*
Tanner, H.G., Advanced Agricultural Robots: Kinematics and Dynamics of Multiple Mobile Manipulators Handling Non-Rigid Materials, Computers and Electronics in Agriculture 31 (2001) 91-105.*
Hvilshoj, M., "Little Helper"—An Autonomous Industrial Mobile Manipulator Concept, International Journal of Advanced Robotics Systems, vol. 8, No. 2 (2011) p. 80-90.*
Steidle, D., et al Stable Stacking for the Distributors Pallet Packing Problem, IEEE/RSJ International Conference on Intelligent Robots and Systems, Oct. 18-22, 2010, Taipai Taiwan.*
Fiorini, P., et al An Autonomous Robot for Indorr Light Logistics, Proceedings 2004 IEEE/RSJ International Conference on Intelligent Robots and Systems Sep. 26-Oct. 2, 2004, Sendai, Japan.*
Frost, T., Automated Shipboard Build-up of Customized Pallet Loads, Navy SBIR 2010.1—Topic N101-091 Dec. 10, 2009 http://www.navysbir.com/n10_1/N101-091.htm.*
Balakirsky_2010 (Metrixs for Mixed Pallet Stacking, PERMIS' 10 Sep. 28-30, 2010 Baltimore, MD USA).*
Rantan_2011 (Securing Images Using Inversion and Shifting, Proceedings of the International Conference on Soft Computing for Problem Solving (SocProS 2011) Dec. 20-22, 2011—vol. 2).*
Amin_1995 (The Lack of Protection Afforded Software under the Current Intellectual Property Laws, Cleveland State Law Review, 1995).*

Machine Vision defined by Wikipedia archived Jan. 15, 2012 downloaded from https://en.wikipedia.org/w/index.php?title=Machine_vision&oldid=471584781.*
Tomlinson_2009 (History and Impact of the Intermodal Shipping Container, Pratt Institute, Sep. 22, 2009).*
James_1999 (H.T. Dean, J. N. Baggaley and R.J.W. James, Three Dimensional Container Packing of Drums and Pallets, University of Canterbury, New Zealand, 1999).*
Kamlang_2008 (On the Government of Electronic Bills of Lading, Univerity of Oslo, Sep. 4, 2008).*
Bao_2012 (Object Co-detection, (S. Y.-Z. Bao, Y. Xiang, and S. Savarese, "Object co-detection," in Proc. Eur. Conf. Comput. Vision, Firenze, Italy, Oct. 7-13, 2012).*
Frost (Automated Shipboard Build-up of Customized Pallet Loads, Dec. 10, 2009.*
Fiorini (An Autonomous Robot for Indoor Light Logistics, 2004).*
Schlenoff_2011 (Performance Evaluation of Intelligent Systems at the National Institute of Standards and Technology (NIST), ITEA Journal 2011; 32: 59-67).*
DARPA_2007 (DARPA Grand Challenge: Urban Challenge Rules, Oct. 27, 2007).
Templeton 2011 (Deliverbots—self-driving delivery robots https://www.templetons.com/brad/robocars/deliverbots.htmlarchived Feb. 9, 2011).
Fraizer_2011 (ARMADA: Autonomous Robotic Mail and Delivery Assistant, Dept. of CIS—Senior Design 2010-2011).
TEUN_2009 (The Best Way to Unload a Container, Lex de Prieelle, downloaded from https://www.youtube.com/watch?v=Mc-IC1yclgU).
Brandon_2009 (Retrofit kit allows cars to drive themselves, http://newatlas.com/kairos-autonomi-pronto4/13417/Nov._23, 2009).
McBride_2007 (DARPA Urban Challenge Intelligent Vehicle Systems Technical Paper, IVS Team, Apr. 13, 2007).
DARPA_Grand_Challenge_Wiki_2011 (DARPA Grand Challenge (2007), Wikipedia archived date: Dec. 4, 2011).
Box_Truck_2012 (Box Truck Defined, Archived Wikipedia Jan. 11, 2012 downloaded from https:en.wikipedia.org/w/index.php?title=Box_truck&oldid=470811655).
The New World Thesarus published by Webster's New World New York, 1985.
Enon_2006 (Enon—Fujitsu's Service Robot, Robot News, Apr. 8, 2006, downloaded from (http:Uphotosl.blogger.com/blogger/6323/2375/1600//Fujitsu%20Enon1.3.jpg).
The Randomhouse College Dictionary: Revised Edition dated 1982.
Fiorini_2008.pdf Fiorini, P., Introducing Service Robotics to the Pharmaceutical Industry, Intel Serv Robotics (2008) 1:267-280 DOI 10.1007/s11370-008-0019-2.
By Bogh (Autonomous Industrial Mobil Manipulation (AIMM): From Research to Industry. In Proceedings of the $42^{nd}$ International Symposium on Robotics. VDE Verlag GMBH, 2011).
Ramde (Driverless Truck Lurches Out of Lab, The Washington Post, Tuesday, Oct. 2, 2007, 10:49 PM).
Fetzek (Behavior-Based Power Management in Autonomous Mobile Robots, Thesis, Air Force Institute of Technology Wright-Patterson Air Force Base Ohio, Mar. 2008).
Correa, A., Multimodal Interaction with an Autonomous forklift, IEEE, 2010.
Coleman, N., Smart Crane Ammunition Transfer System: Real-Time Control, American Institute of Aeronautic and Astronautics, Inc., 1998.
Cox, W., Robots Replace Dock Workers, Dec. 19, 2005 http://robotshop.com /blogs/en/robots-replace-dock-workers-4097.
McIlraith, S., CSC2542 Representations for (Classical) Planning problem, Department of Computer Science University of Toronto, 2010.
Anders, R., BEAR robot loading a truck, Aug 3, 2006 https://www/youtube.com/watch?=shSyxA_eflk.
DARPA Autonomous robot cars drive DARPA Urban challenge, Feb. 20, 2008 http://youtube/pontv2mbihA.
Enterprise Resource Planning (ERP) Wikipedia Archive dated Feb. 25, 2011 http://en.wikipedia.org/w/index.php?title=Enterprise_resource_planning&oldid=415865075.

(56) References Cited

OTHER PUBLICATIONS

Manufacturing Execution System (MES) Wikipedia Archive dated Feb. 23, 2012 http://en.wikipedia.org/w/index.php?title=Manufacturing_execution_system&oldid=478343 . . . .

* cited by examiner

MONITORING ONE OR MORE ARTICLES ON A SUPPORT SURFACE

RELATED APPLICATIONS

This application claims priority to U.S. Provisional Application Ser. No. 61/607,319 filed on Mar. 6, 2012, which is hereby incorporated by reference in its entirety.

BACKGROUND OF THE INVENTION

1. Technical Field

The present invention relates generally to article handling and monitoring and, more particularly, to loading articles on one or more support surfaces with a mobile device and to monitoring the arranged articles before, during and/or after transportation of the loaded support surfaces.

2. Background Information

Transporting articles from one location to another is a common task undertaken by a majority of businesses and various other enterprises, and is sometimes generally referred to as "material handling". The military and shipping services such as the U.S. Postal Service, FedEx® and the like, for example, utilize supply chains to pickup, transport and deliver various types of articles between different locations worldwide. The term "logistics" may be used to describe flow management of the articles and information for transporting, inventorying, warehousing, material handling and packaging of the articles within such supply chains.

Typical material handling and logistical tasks may include handling articles at their source, their destination and many points in-between. These tasks frequently involve packaging and/or repackaging a variety of articles into larger or smaller packages, pallets, containers and the like for shipping across a distance. These tasks may also involve unpacking the articles at their destination for storage, use, delivery or further transportation. Additionally, articles frequently are moved and stored at various places at various times within a particular building or group of buildings, such as in a manufacturing operation, hospital, or warehouse as well as an aircraft, ship, cargo plane or other military environment.

At their source, order picking (also referred to as "palletizing") typically is employed in a warehouse or other location where a number of articles are taken from a number of source locations, such as pallets, for example, and placed on a destination or shipping pallet or other shipping container or the like. Once filled, the pallet or container is then taken to a loading dock or similar area where it may be packaged, such as with strapping, shrink wrap or the like, and loaded into a transport vehicle such as, for example, a truck, rail car, plane, helicopter, ship or other vehicle.

At their destination, the pallets or containers are removed from their transport vehicles. The articles may subsequently be removed from the pallets or containers and placed in another transport vehicle or another storage location for further shipment, storage or use. This process and associated tasks are routinely undertaken by businesses on a daily basis and are an integral part of providing cargo for private and military use in locations around the world and must be accomplished with a high degree of accuracy to avoid additional costs and to sustain or increase customer satisfaction.

In many operations, order picking and pallet or container unloading is performed using manual labor, which is not only time consuming and labor intensive, but is subject to errors and injury to workers particularly with heavier loads. Additionally, workers typically use various types of equipment to make such tasks easier, such as forklifts, pallet jacks and conveyor belts, for example, which not only require a substantial amount of capital for purchasing and maintaining such equipment but are limited in the environments where they can be employed and create serious safety hazards in the work environment.

Although automated systems have been developed, they typically are fixed installation types of systems that require a substantial amount of infrastructure installation and facility renovation and simply cannot be flexibly deployed in different warehouses, manufacturing facilities, planes, ships or other environments as needed. This required infrastructure and renovation not only dramatically increases the cost, complexity and maintenance of such systems, but also limits their application to large warehouses and operations with significant budgets. Additionally, if such systems go down for repair or maintenance the entire material handling operation is typically shut down if not significantly disrupted since those systems take up a substantial amount of floor space thereby inhibiting any backup systems from being employed, such as using forklifts or fork trucks, for example.

It would be desirable therefore to provide a readily deployable and near-zero infrastructure solution to the above and other needs.

SUMMARY OF THE DISCLOSURE

Devices, systems and methods are provided for monitoring a plurality of articles arranged on a support surface according to an article arrangement modeled with a first processing device. One of the methods includes receiving image data generated from the modeled article arrangement. The image data is received by a second processing device, and is indicative of an image of the arranged articles on the support surface. The received image data is used to inspect the arranged articles.

BRIEF DESCRIPTION OF THE DRAWINGS

The following detailed description will be better understood when read in conjunction with the appended drawings, in which there is shown one or more of the multiple embodiments of the present disclosure. It should be understood, however, that the various embodiments of the present disclosure are not limited to the precise arrangements and instrumentalities shown in the drawings.

FIG. 10A is an illustration of an article arrangement wrapped with packaging material;

FIG. 10B is an illustration of the article arrangement of FIG. 10A subsequent to being tampered with;

DETAILED DESCRIPTION OF THE INVENTION

Autonomous devices, systems and/or methods may perform one or more tasks without continuous outside control and/or intervention. An autonomous mobile robot, for example, may receive instructions to perform a certain task at a certain location. The mobile robot may subsequently determine and perform the operation(s) necessary to move to the location and/or complete the task based on, for example, its current location, surrounding obstacles, its operating environment, the type of task to be performed, etc. Such autonomous devices, systems and/or methods may also adapt to unknown, new and/or changing operating environments without additional outside control and/or intervention.

Autonomous devices, systems and/or methods may be fully autonomous or semi-autonomous. The term "fully autonomous" is used to describe a device, system and/or method that may perform one or more tasks without, for example, any outside control and/or intervention. A fully autonomous mobile robot, for example, may perform a task without receiving instructions (e.g., vectors, commands, etc.) from a human operator during performance of the task. The term "semi-autonomous" is used to describe a device, system and/or method that may perform one or more tasks without, for example, continuous outside control. A semi-autonomous mobile robot, for example, may perform a task utilizing one or more periodic instructions from a human operator that bound and/or qualify the performance of the task. The instructions, for example, may provide an updated location of where the task is to be performed, identify an unknown obstacle, control the scope of the task, control when the task should be performed, etc.

Figure 1:
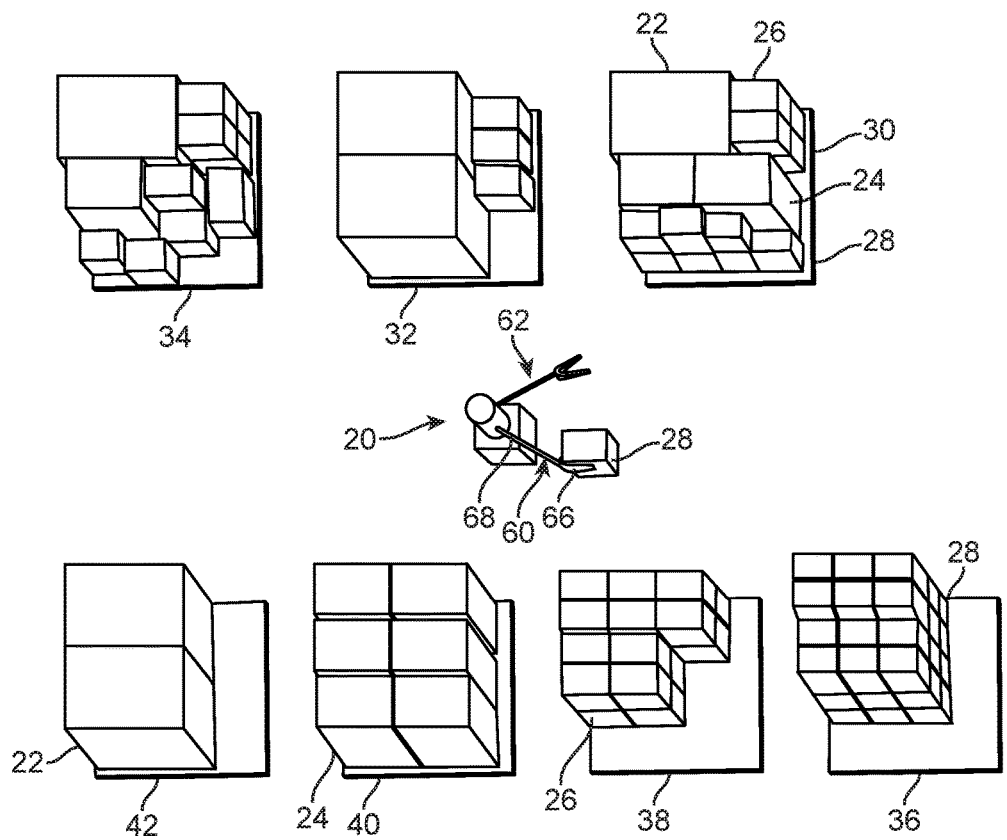
FIG. 1 is an illustration of an electro-mechanical mobile device loading one or more articles onto one or more support surfaces.

FIG. 1 illustrates an electro-mechanical mobile device 20 (e.g., an autonomous mobile robot) autonomously performing a task of loading one or more articles 22, 24, 26 and 28 onto one or more support surfaces 30, 32 and 34, where these articles may have different (or similar) shapes, sizes, weights, etc. Examples of articles include boxes, crates, containers, packages, barrels, canisters, luggage, chests, and amorphous bags, sacks and other such objects. Other examples of articles include electronic and/or mechanical devices and equipment, etc. Examples of support surfaces include pallets, cargo bay floors, warehouse floors, truck beds, ship hold floors, etc. Other examples of support surfaces include interior surfaces of support containers, boxes and the like in which the articles may be placed and subsequently transported and/or stored. The present invention of course is not limited to any particular article and/or support surface type or configuration.

Briefly, the mobile device 20 may load one or more of the articles 22, 24, 26 and 28 onto a first of the support surfaces (e.g., the transport pallet 30), for example, by gathering the articles from one or more respective source pallets 36, 38, 40 and 42 and arranging the gathered articles onto the first support surface 30. Each of the source pallets 36, 38, 40 and 42 is located at a respective article pickup location, and may support (e.g., hold) similar types of articles; e.g., the source pallet 36 supports the articles 28, the source pallet 38 supports the articles 26, etc. Each of the support surfaces 30, 32 and 34 is located at a respective support surface location and may support one or more different types of articles. The articles loaded onto the first support surface 30 may be selected based on, for example, a destination of the first support surface, intended (e.g., medical, culinary, warfare/combat, humanitarian aid, etc.) use of the articles, etc. Subsequent to the loading, the mobile device 20 or another device (e.g., a fork lift, crane, conveyor, etc.) may move the loaded first support surface 30 onto a vehicle (e.g., a ship, train, truck, helicopter, airplane, submersible, spacecraft, etc.) for transport to another location (e.g., final destination), or into a building (e.g., warehouse, business, etc.) or other facility for storage or subsequent distribution.

Figure 2:
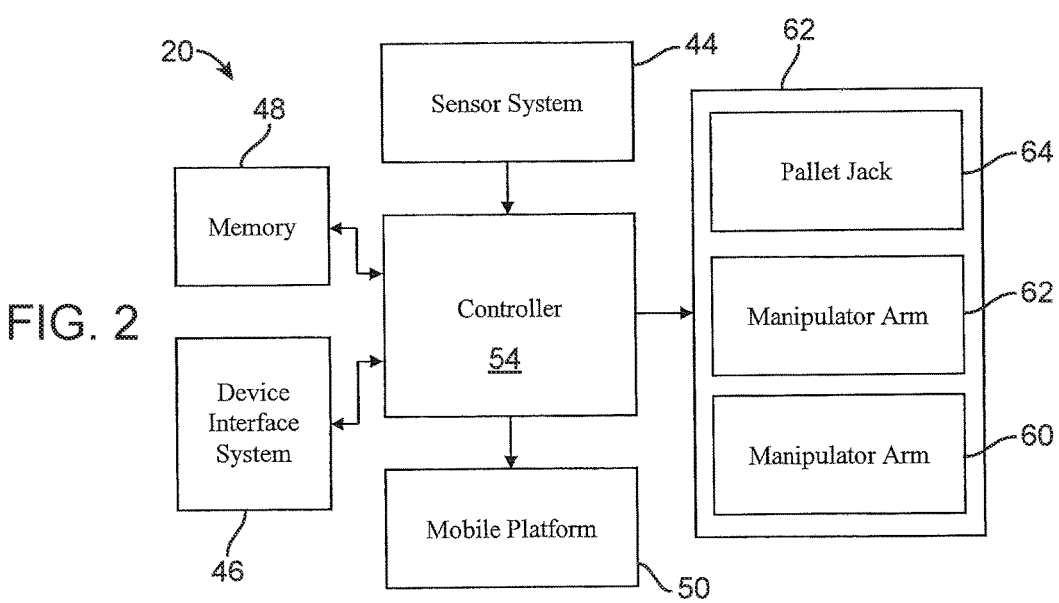
FIG. 2 is a system block diagram illustration of an electro-mechanical mobile device.

FIG. 2 is a system block diagram illustration of the mobile device 20. The mobile device 20 includes device electronics and/or mechanisms operable to (e.g., fully and/or semi-) autonomously perform one or more tasks such as, for example, loading article(s) onto support surface(s) as illustrated in FIG. 1. The device electronics and/or mechanisms may include a sensor system 44, a device interface system 46, memory 48, a mobile platform 50 (e.g., drive system), a manipulator system 52, and a controller 54. The present invention of course is not to be limited to the aforesaid electronics and/or mechanisms, and may include alternate electronics and/or mechanisms other than those specifically described herein as well as known or future equivalents thereof.

The sensor system 44 is configured to survey the mobile device's surroundings and operating environment, and/or to receive location data. The sensor system 44 may include, for example, one or more location and/or proximity sensors that spatially locate (e.g., triangulate) the mobile device 20 relative to, for example, its surrounding environment, its geographic location, and/or one or more locators (e.g., RF tags, physical landmarks, etc.). Examples of location and/or proximity sensors include, but are not limited to, global positioning system (GPS) receivers, radar systems, sonar systems, infrared sensors, lasers, cameras, radio transceivers, etc. The sensor system 44 may additionally or alternatively include one or more cameras, one or more electro-acoustic transducers (e.g., microphones), etc.

The device interface system 46 is configured to receive instructions (e.g., vectors, commands, etc.) in the form of control data from an operator and/or from a remote control system. The device interface system 46 may also be configured to communicate data to the operator and/or to the remote control system. The device interface system 46 may include a communication device and/or an operator interface. The communication device may include a cellular, satellite and/or radio transmitter, and/or a cellular, satellite and/or radio receiver. The operator interface may include one or more input and/or output (I/O) devices such as, for example, a display screen, a speaker, a touch screen, a keypad, a voice command system with an electro-acoustic transducer (e.g., microphone), etc.

The memory 48 (e.g., a non-transitory computer readable medium) may be configured to store software (e.g., program instructions) for execution by the controller 54. The memory may include a volatile memory and/or a nonvolatile memory. Examples of a volatile memory may include a random access memory (RAM) such as a dynamic random access memory (DRAM), a static random access memory (SRAM), a synchronous dynamic random access memory (SDRAM), a video random access memory (VRAM), etc. Examples of a nonvolatile memory may include a read only memory (ROM), an electrically erasable programmable read-only memory (EEPROM), a computer hard drive, etc.

Figure 4:
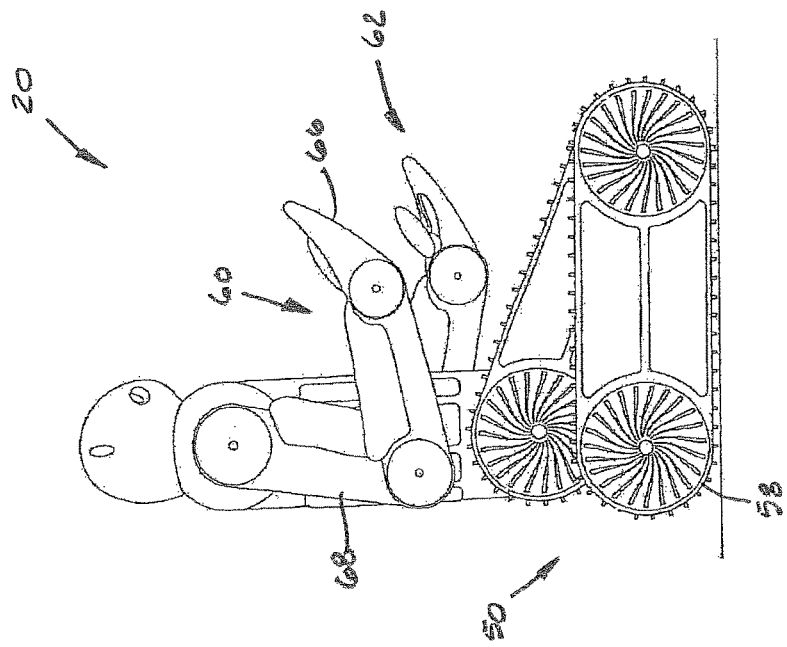
FIG. 4 is an illustration of another autonomous mobile robot embodiment of the mobile device of FIG. 2.
Figure 3:
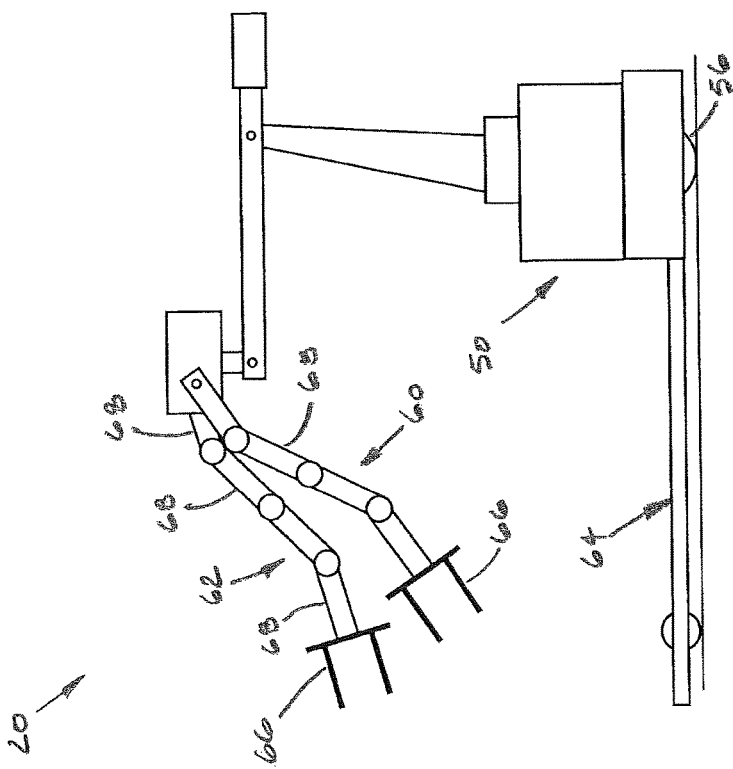
FIG. 3 is an illustration of an autonomous mobile robot embodiment of the mobile device of FIG. 2.

The mobile platform 50 is configured to move the mobile device 20 to various locations within its operative environment. The mobile platform 50 may include one or more motorized and/or steerable propulsion devices such as, for example, motorized drive wheels, motorized track systems, etc. An embodiment of the mobile platform 50 with motorized drive wheels 56 is illustrated in FIG. 3. An embodiment of the mobile platform 50 with motorized (e.g., robotic and multi-linkage) track systems 58 is illustrated in FIG. 4. The present invention of course is not limited to the aforesaid mobile platform configurations and components.

Referring again to FIG. 2, the manipulator system 52 includes one or more electronically, hydraulically, pneumatically and/or mechanically actuated manipulators 60, 62 and 64 configured to move one or more articles within the operative environment. Examples of a manipulator include, but are not limited to, a robotic manipulator arm (e.g., a multi-axis manipulator arm), a pallet jack, a lift platform, a conveyor system, a slide carriage, a crane, etc. In the specific embodiment illustrated in FIG. 3, the manipulator system 52 includes a plurality of robotic manipulator arms 60 and 62 and a pallet jack 64. Each of the robotic manipulator aims 60 and 62 includes an end effector 66 connected to one or more arm members 68 (e.g., linkages). Examples of an end effector include, but are not limited to, a gripping device, a suction device, an electromagnet, a winch, a clasp, etc. Alternative examples of a manipulator system are disclosed in U.S. Pat. Nos. 7,902,784; 7,719,222 and 7,348,747, each of which is hereby incorporated by reference in its entirety.

Referring again to FIG. 2, the controller 54 may be implemented using hardware or a combination of hardware and software. The controller 54 may include one or more processing devices, analog and/or digital circuitry, etc. The controller 54 is in signal communication (e.g., hardwired or wirelessly connected) with the sensor system 44, the device interface system 46, the memory 48, the mobile platform 50 and the manipulator system 52.

Figure 5:
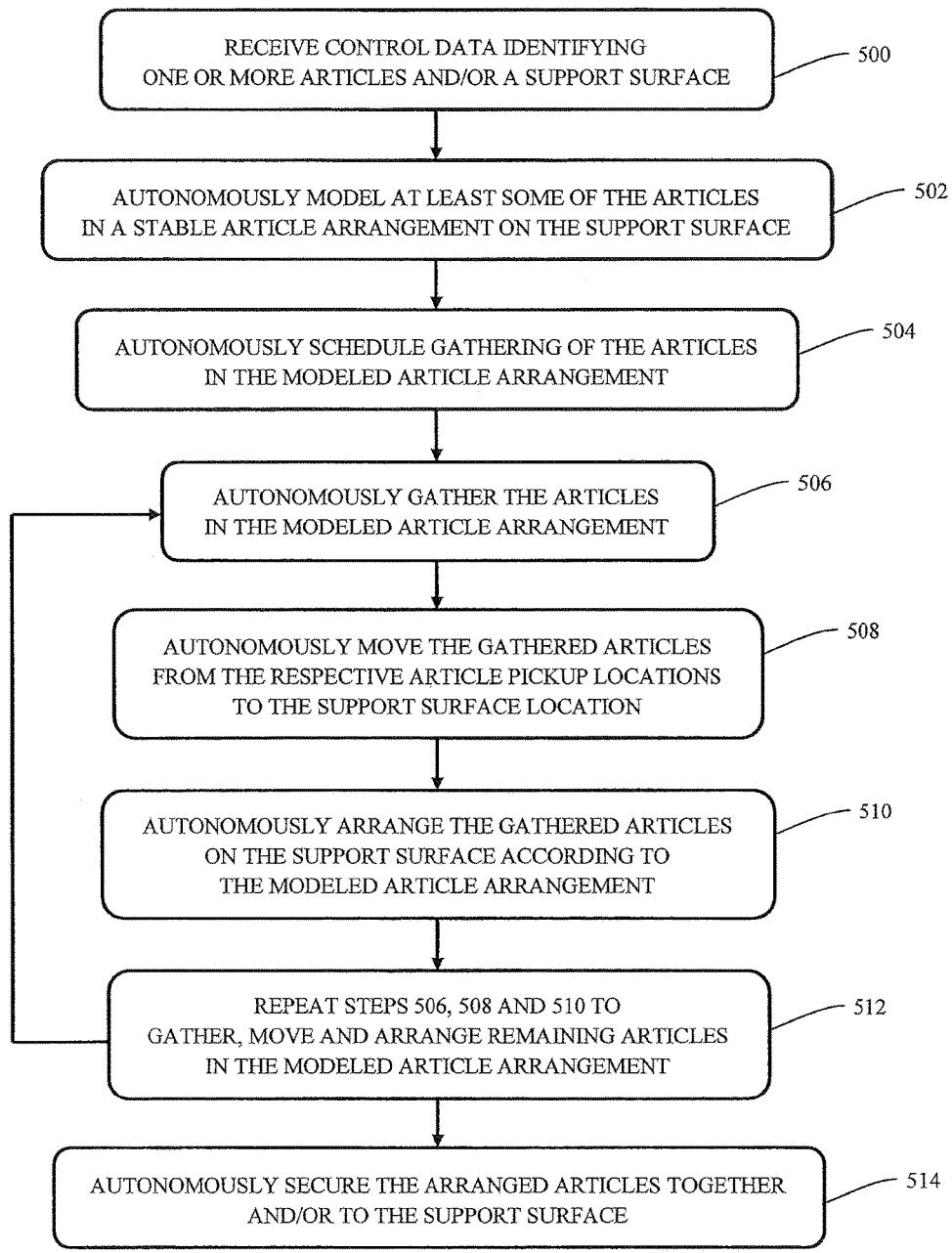
FIG. 5 is a flow diagram of a method for loading articles on a support surface using the mobile device of FIGS. 1 and 2.

FIG. 5 is a flow diagram of a method for loading a plurality of the articles (e.g., the articles 22, 24, 26 and 28) on the first support surface 30 using the mobile device 20 illustrated in FIGS. 1 and 2. In step 500, the controller 54 receives control data (e.g., one or more vectors, commands, etc.) through the device interface system 46. The control data may include inventory data, location data, etc. The inventory data may, for example, identify the contents, types, states (e.g., amorphous or non-amorphous), masses and/or weights, dimensions, et cetera, of the articles to be arranged on the first support surface. The location data may, for example, identify the respective article pickup locations, and/or the respective support surface locations. Alternatively, the controller 54 may autonomously determine the article pickup locations and/or the support surface locations using the sensor system 44 where, for example, the articles and/or the support surfaces are configured with RF ID tags, locator beacons, etc. The controller 54 may alternatively and/or additionally identify the articles using image and shape recognition software. The control data may also include other types of data such as, for example, scheduling data that designates on which support surface(s) and by when and/or in which order the articles should be loaded.

In step 502, the controller 54 autonomously models at least some of the articles (e.g., the articles 22, 24, 26 and 28) in a stable article arrangement on the first support surface 30. The term "stable" is used to describe an article arrangement having, for example, (i) a relatively low center of gravity, (ii) articles that are substantially supported by the support surface and/or other articles in the arrangement, (iii) articles that are (e.g., equally) balanced on the support surface and/or other articles in the arrangement, etc.

Figure 6:
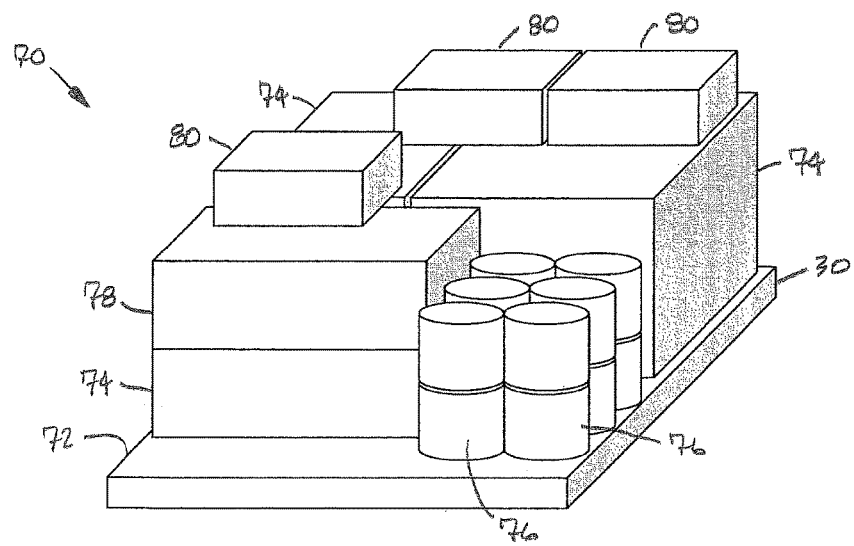
FIG. 6 is an illustration of an embodiment of a stable arrangement of articles on a support surface.

FIG. 6 illustrates an embodiment of a stable article arrangement 70 modeled having a geometry that fits and is positioned within a perimeter 72 of the first support surface 30. Articles (e.g., base articles 74, free standing articles 76, etc.) contacting the first support surface 30 are substantially (e.g., completely) supported by the first support surface 30. Articles 78 and 80 stacked on one or more of the base articles 74 and/or intermediate articles 78 are substantially supported by the respective articles upon which they are stacked. A bottom surface of the intermediate stacked article 78, for example, is substantially (e.g., completely) supported by a top surface of the base article 74, and substantially parallel to the first support surface 30. In another example, each bottom corner of the stacked article 80 is supported by top surfaces of the base articles 74 and the intermediate stacked article 78. The stacked articles 78 and 80 may weigh less than the articles upon which they are stacked. The stacked articles 78 and 80 may also have smaller geometries (e.g., horizontal cross sectional areas, etc) than the articles upon which they are stacked. In some embodiments, the base articles 74 may be staggered relative the stacked articles 80 to interlock the articles together with frictional forces. The present invention of course is not limited to any particular placement and/or arrangement of the articles.

Referring again to FIGS. 1, 2 and 5, the stable article arrangement may be computationally modeled using a constrained optimization program or algorithm such as, for example, a Mix Integer Linear Program (MILP) constrained optimization program. The controller 54, for example, may input a plurality of given, fixed and/or variable parameters into a plurality of equality and/or inequality constraint equations, and subsequently solve the equations using the constrained optimization program. The parameters may be indicative of, for example, (i) a number of articles to be arranged on the support surface, (ii) dimensions of the articles and the support surface, (iii) weights and/or masses of the articles, (iv) dimensions between each article and one or more other articles and/or the support surface, (v) maximum dimensions for the article arrangement, etc. The constraint equations may be formulated to describe, for example, (i) spatial orientations of the articles relative to other articles and/or the support surface, (ii) relative positions of the articles relative to other articles and/or the support surface, (iii) the manner in which the articles are supported, (iv) the order in which the articles will be used at their destination, etc. The present invention of course is not limited to any particular type of optimization programs, parameters and/or constraint equation formulations.

The stable article arrangement may also be modeled to efficiently load and tightly pack the articles 22, 24, 26 and 28 on the first support surface 30. The controller 54, for example, may iteratively change one or more of the parameter values within the constraint equations to model the articles in a plurality of different arrangements. The controller 54 may subsequently identify an optimum modeled article arrangement as, for example, the modeled article arrangement that (i) fits the greatest number of articles on the first support surface 30, (ii) has the greatest arrangement density, and/or (iii) has the greatest control volume density.

The term "arrangement density" is used to describe a ratio of a collective volume of the articles in the modeled article arrangement to an overall volume of the modeled article arrangement. The collective volume may be determined by adding together volumes of the respective articles 22, 24, 26 and 28 in the modeled article arrangement. The overall volume may be determined by adding the collective volume to volumes of respective spaces (e.g., gaps) between the articles 22, 24, 26 and 28 in the modeled article arrangement. The controller 54 may utilize the arrangement density to identify the modeled article arrangement that packs the articles closest together.

The term "control volume density" is used to describe a ratio of the collective volume to a control volume. The control volume may be given, or determined from a surface area of the support surface 30, and a control volume height (e.g., maximum vertical article arrangement height). The control volume height may be sized based on, for example, a height of a shipment container, a trailer, a cargo hold, etc. The control volume density may be utilized by the controller 54 to identify the modeled article arrangement that most efficiently packs the articles 22, 24, 26 and 28 within the control volume.

In step 504, the controller 54 autonomously schedules the order in which the articles 22, 24, 26 and 28 in the optimum modeled article arrangement are to be gathered and moved to the first support surface 30 location. The controller 54, for example, may schedule the base articles to be gathered and moved before the stacked articles such that the stacked articles may be properly disposed on the base articles. In another example, the controller 54 may schedule the article proximate a back side of the first support surface to be gathered and moved before the articles proximate to a front side of the first support surface.

In step 506, the mobile device 20 autonomously gathers one or more of the articles (e.g., the article 28) in the optimum modeled article arrangement. The controller 54, for example, may signal the mobile platform 50 to move the mobile device 20 to the article 28 pickup location. The controller 54 may subsequently signal the manipulator system 52 to pick up the article 28 with one or more of the robotic manipulator arms (e.g., the manipulator arm 60). The end effector 66, for example, may engage (e.g., grip) the article 28 utilizing one of a plurality of (e.g., predetermined) article engagement (e.g., gripping) techniques, and the arm member 68 may lift the article 28 off of the respective source pallet 36. In another example, the controller 54 may signal the manipulator system 52 to pick up one of the articles with the first robotic manipulator arm 60, and to pick up another one of the articles with the second robotic manipulator arm 62.

Figure 7:
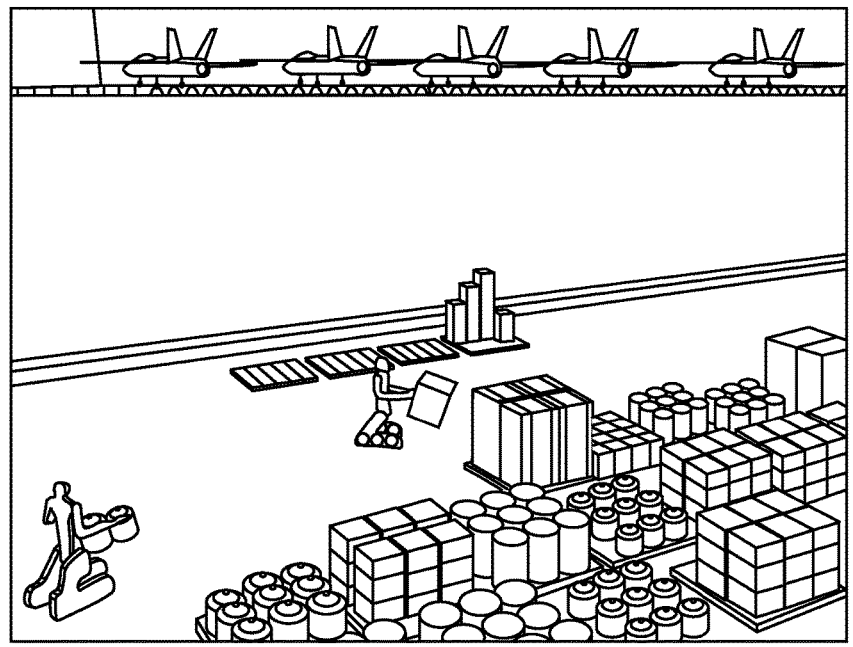
FIG. 7 is an illustration of a plurality of autonomous mobile robots loading a plurality of support surfaces.
Figure 8:
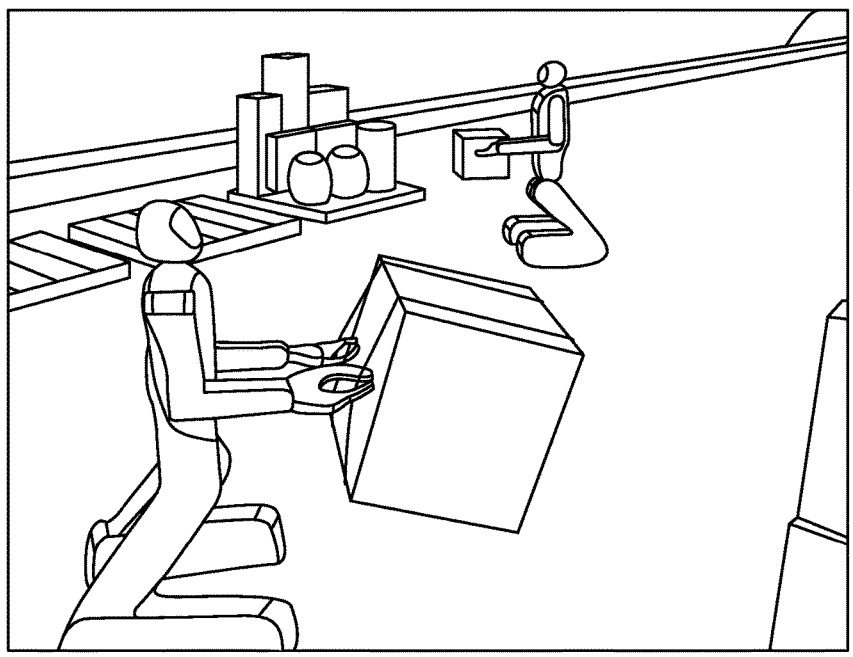
FIG. 8 is another illustration of the mobile robots of FIG. 7 loading the support surfaces.
Figure 9A:
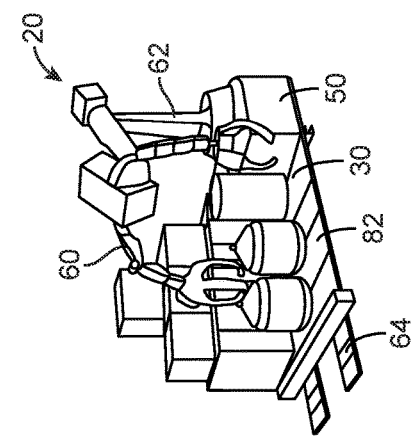
FIGS. 9A-9F are illustrations of another embodiment of the mobile device of FIG. 2 arranging articles on a support surface.
Figure 9D:
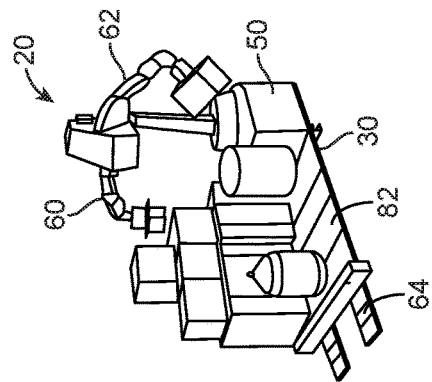
Figure 9B:
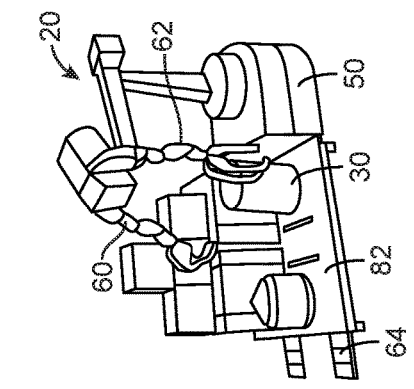
Figure 9E:
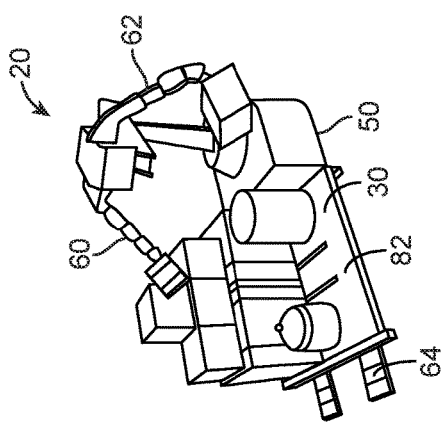
Figure 9C:
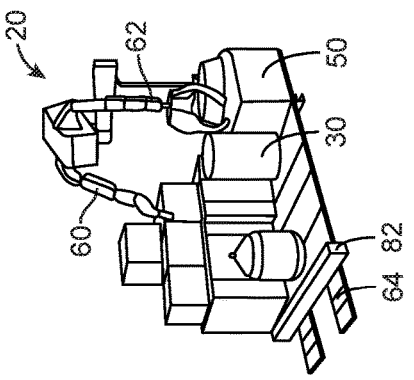
Figure 9F:
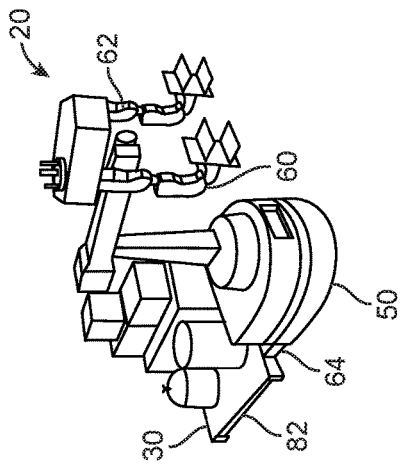

The controller 54 may select the article engagement technique used to engage (e.g., grip, push, etc.) the article(s) based on, for example, the type and/or state of the article 28 being gathered, the orientation of the article 28 relative to the source pallet 36 and/or the mobile device 20, how the article is to be moved (e.g., lifted, pushed, cradled, etc.), etc. Each of the article engagement techniques may define, for example, a specific gripping force or range of gripping forces, a relative end effector spatial orientation, how far to open the (e.g., gripping) end effectors 66, etc. The controller 54, for example, may select a gripping technique that uses a relatively large gripping force to grasp a heavy article, and a relatively small gripping force to grasp a light or fragile article or an article having an amorphous state. FIGS. 7 and 8 illustrate a plurality of autonomous mobile robots utilizing various examples of the gripping techniques.

Referring again to FIGS. 1, 2 and 5, in step 508, the mobile device 20 autonomously moves the gathered article(s) from the respective article pickup location(s) to the first support surface 30 location. The controller 54, for example, may signal the mobile platform 50 to move the mobile device 20 from the first article pickup location to the first support surface location.

In step 510, the mobile device 20 autonomously arranges the gathered article(s) on the first support surface 30 according to the optimum modeled article arrangement. The controller 54, for example, may signal the manipulator system 52 to place the article 28 in a particular position and orientation on the first support surface 30 using, for example, the robotic manipulator arm 60 holding the article 28.

In step 512, the mobile device 20 may repeat the steps 506, 508 and 510 to gather, move and arrange the remaining articles of the optimum modeled article arrangement.

In step 514, the mobile device 20 may autonomously secure the articles 22, 24, 26 and 28 together and/or to the first support surface 30. The mobile device 20, for example, may utilize the manipulator system 52 to wrap the articles together in packaging material such as, for example, shrink wrap, transparent or non-transparent plastic wrap, etc. In another example, the mobile device 20 may utilize the manipulator system 52 to secure the article arrangement to the first support surface 30 with, for example, tie down straps.

In some embodiments, the step 508 may be omitted from the method of FIG. 5 where, for example, the articles 22, 24, 26 and 28 may be respectively gathered and subsequently (e.g., immediately) arranged on the first support surface 30. Such an embodiment is illustrated in FIGS. 9A-9F where the pallet jack 64 is engaged with a pallet 82 that defines the first support surface 30. In other embodiments, the pallet 82 may be utilized to temporarily hold the gathered article(s) during movement of the article(s) between the article pickup location(s) and the first support surface location; i.e., where the step 508 is not omitted.

In some embodiments, where the articles identified in the step 500 cannot fit within the control volume of a single support surface, the controller 54 may model a first grouping of the articles in a first stable article arrangement on the first support surface, a second grouping of the articles in a second stable article arrangement on a second support surface, etc. The controller 54 may also utilize the constrained optimization program to reduce (e.g., minimize) the number of support surfaces necessary to hold the identified articles. In such an embodiment, the mobile device 20 may perform the steps 506, 508 and 510 iteratively for each of the modeled article arrangements, or substantially concurrently in a manner that reduces (e.g., minimizes) loading time. The loading time may be minimized, for example, by gathering and arranging a similar type of the articles onto a plurality of the support surfaces before beginning the gathering and arranging of another type of the articles. Alternatively, the mobile device 20 may signal a second mobile device to load the second support surface while the mobile device 20 loads the first support surface, etc.

In some embodiments, the constraint equations used in the step 502 may be weighted in order to arrange certain types of the articles at certain positions within the modeled article arrangement. Such weighting may be useful, for example, where certain types of the articles are scheduled to be unpacked at a final destination before other types of the articles, are scheduled to be removed mid-transit, etc.

In alternate embodiments, a remote control system may be provided that autonomously controls one or more mobile devices to load one or more support surfaces. The control system, for example, may perform the steps 500, 502 and 504 and subsequently autonomously coordinate and signal a first of the mobile devices and a second of the mobile devices to gather and arrange respective articles on the first support surface. In another example, the control system may autonomously coordinate and signal the first of the mobile devices and the second of the mobile devices to gather and arrange respective articles on different support surfaces that are to be transported to and/or stored in, for example, the same location. In some embodiments, the control system may select which of the mobile devices loads which of the support surfaces based on, for example, the mobile device's proximity to the article pickup locations and/or support surface locations, the mobile device's load capacities or fuel/battery level, etc.

Figures 10A, 10B:
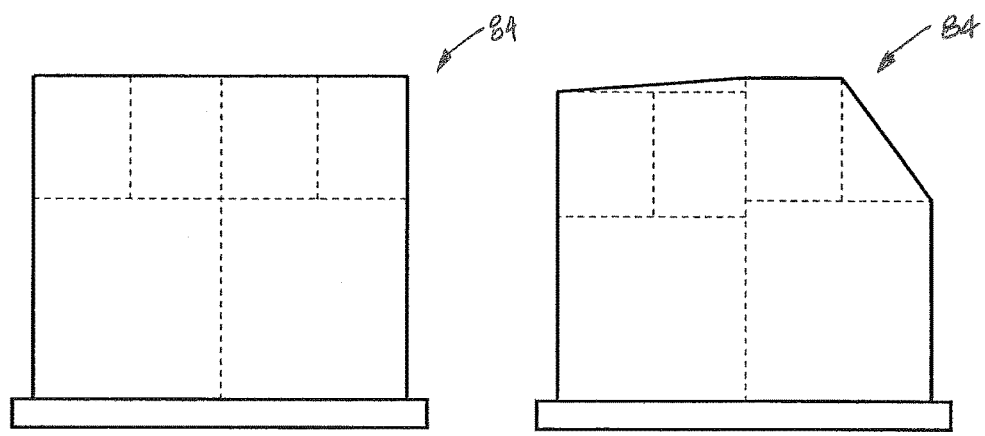

During transportation, warehousing and/or storage of a loaded support surface, one or more articles in an article arrangement 84 on the support surface may be damaged, stolen, replaced with other articles, or otherwise tampered with, which may alter the geometry and appearance of the article arrangement as illustrated in FIGS. 10A and 10B. The geometry and appearance of the article arrangement 84 may change, for example, where (i) one of the perimeter articles is missing, (ii) one of the articles is replaced with an article having a different size or physical appearance, (iii) the packaging material wrapped around the article arrangement is removed and replaced with different packaging material or wrapped in a different manner, etc.

Figure 11:
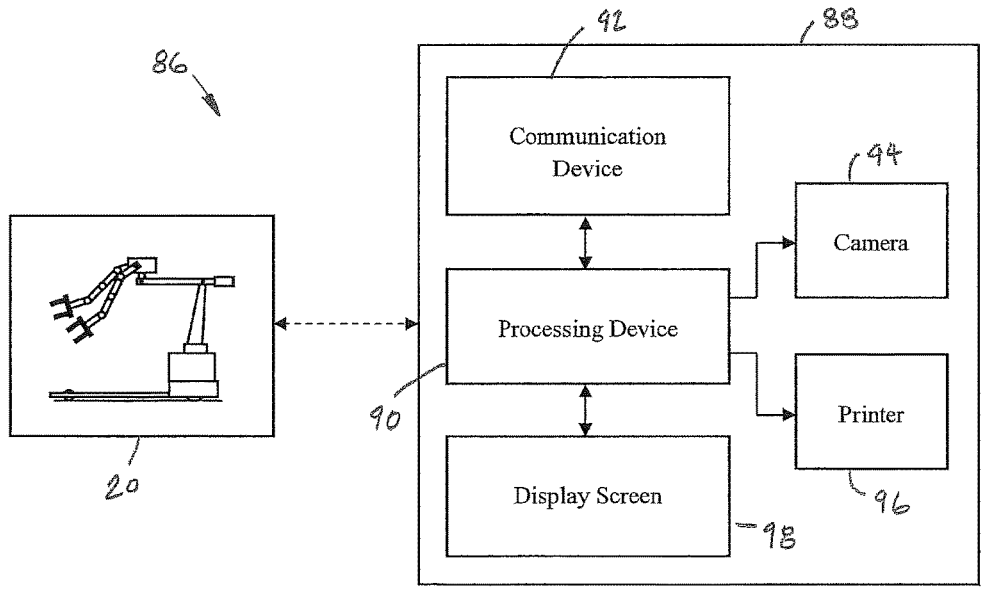
FIG. 11 is a block diagram illustration of a system for monitoring articles in an article arrangement on a loaded support surface.

FIG. 11 illustrates a system 86 for monitoring articles in an article arrangement on a loaded support surface. The system 86 may include the mobile device 20 and an article inspection system 88. The article inspection system 88 includes a processing device 90 that is in signal communication with a communication device 92 as well as a camera 94, a printer 96 and/or a display screen 98. The mobile device 20 may be located at a first location (e.g., an article distribution/loading facility, etc.), and the article inspection system 88 may be located at a second location (e.g., an article receiving facility, another article distribution/loading facility, a final destination, etc.).

Figure 12:
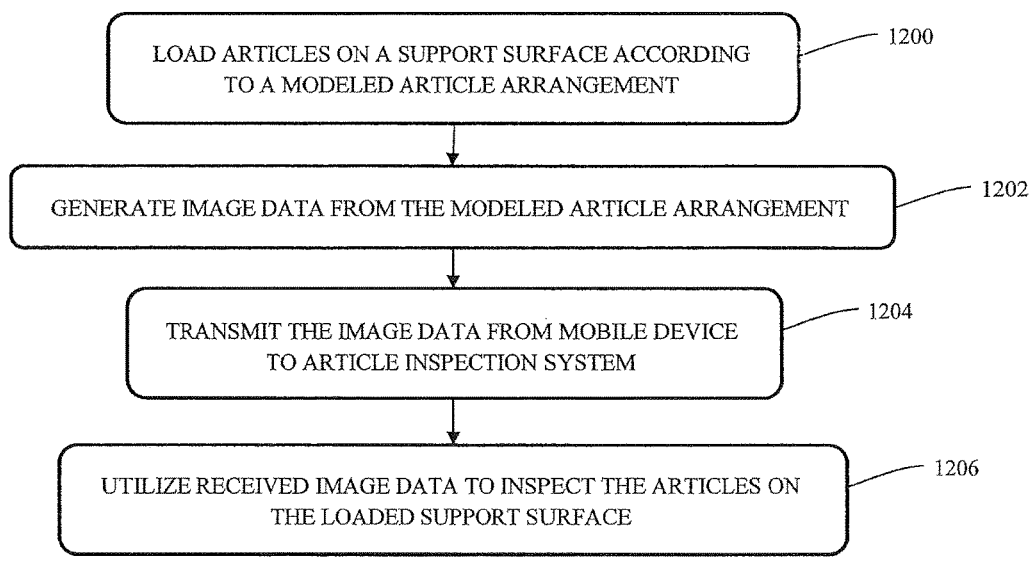
FIG. 12 is a flow diagram of a method for monitoring articles in an article arrangement on a loaded support surface using the system of FIG. 11.

FIG. 12 is a flow diagram of a method for monitoring the articles in an article arrangement using the system 86 of FIG. 11. In step 1200, the mobile device 20 performs the method of FIG. 5 to arrange the articles on the support surface according to an autonomously modeled article arrangement.

In step 1202, the controller 54 (see FIG. 2) generates image data from the modeled article arrangement, where the image data is indicative of an image of the arranged articles on the loaded support surface. The imaged data may be generated, for example, by processing the modeled article arrangement with given or determined dimensions and geometries of the articles in the modeled article arrangement. The controller 54 may also fit a surface to the modeled article arrangement to represent the packaging material wrapped around the articles in the step 514 (see, e.g., FIGS. 10A and 10B). It is contemplated that image data may include a datum that establishes an image coordinate system for the image.

In step 1204, the mobile device 20 transmits the image data to the processing device 90 through the communication device 92. The image data may be transmitted before, after and/or during the transportation of the loaded support surface from the first location to the second location.

In step 1206, the image data received by the processing device 90 is utilized to inspect the arranged articles on the loaded support surface at the second location. The processing device 90, for example, may signal the printer 96 to print the image of the arranged articles. An inspector, security guard, dock worker, government employee, etc. may subsequently visually compare the arranged articles on the loaded support surface to the printed image to determine whether any of the articles are damaged, tampered with, missing, etc. In another example, the processing device 90 may signal the display screen 98 to display the image of the arranged articles such that it may be visually compared to the arranged articles on the loaded support surface.

In other embodiments, the processing device 90 may receive second image data from the camera 94, where the second image data is indicative of a second image of the arranged articles on the loaded support surface at the second location. The processing device 90 may subsequently compare one or more image characteristics between the first image data and the second image data to determine whether any of the articles are damaged, tampered with, missing, etc. The image characteristics may be compared utilizing, for example, image and/or shape recognition software. In some embodiments, the inspection system 88 may autonomously generate the second image data with the camera 94 and compare the first and second image data where, for example, the inspection system 88 is configured as the mobile device 20 described above.

In other embodiments, the method of FIG. 12 may be utilized to inspect the articles on the loaded support surface before they have been transported to the second location, or during transit to the second location.

A person of skill in the art will recognize that the methods of FIGS. 5 and 12 and the various embodiments thereof may be performed by devices and systems other than those specifically described above. A stationary robotic device, a mobile or stationary crane system, a conveyor system as well as various stationary or mobile manipulator devices, for example, may be adapted to perform one or more of the afore-described methods.

A person of skill in the art will also recognize that the modeled article arrangement utilized in the method of FIG. 12 need not be autonomously modeled as set forth in the step 1200. The modeled article arrangement, for example, maybe developed by a worker to provide a plan of how the articles should be arranged by loading personnel on the support surface.

It is to be understood that the terminology used herein is used for the purpose of describing specific embodiments, and is not intended to limit the scope of the present invention. It should be noted that as used herein, the singular forms of "a", "an" and "the" include plural references unless the context clearly dictates otherwise. In addition, unless defined otherwise, all technical and scientific terms used herein have the same meaning as commonly understood by one of ordinary skill in the art to which this invention belongs.

Although the description above contains many specific examples, these should not be construed as limiting the scope of the embodiments of the present disclosure, but as merely providing illustrations of some of the presently preferred embodiments of the present invention. It will be appreciated by those skilled in the art that changes could be made to the embodiments described above without departing from the broad inventive concept thereof. It is to be understood therefore that this disclosure is not limited to the specific embodiments disclosed herein, but it is intended to cover modifications within the spirit and scope of the embodiments of the present disclosure. Accordingly, the present invention is not to be restricted except in light of the attached claims and their equivalents.

What is claimed is:

1. A method for autonomously determining potential tampering or damage of a shipment of a plurality of articles at a destination point without any human intervention, the method comprising:

providing a list of the plurality of articles to be shipped to a destination point, the list of plurality of articles comprising a first article having a rectangular shape and a second article having a non-rectangular shape and a third article having an amorphous shape, and a fourth article having a shape wherein the shape of the fourth article is rectangular, non-rectangular or amorphous;

modeling the plurality of articles provided on the list in an article arrangement for placement on a first support surface using a first processing device to yield a modeled article arrangement;

arranging the plurality of articles on the first support surface according to the modeled article arrangement using a fully autonomous mobile robot to yield a first article arrangement;

electronically generating a first set of digital image data from the modeled article arrangement, wherein the digital image data is indicative of a digital image of all of the first article arrangement on the first support surface at a first point in time at a first shipping point for the plurality of articles;

providing a second set of digital image data from a digital camera, the second set of digital image data being indicative of a second article arrangement on a second support surface at a second point in time at a second destination point for the second article arrangement, the second destination point being geographically remote from the first shipping point, wherein the first article arrangement on the first support surface are in a different configuration from the second article arrangement on the second support surface;

receiving the second set of digital image data by a second processing device; and comparing autonomously and electronically, via the second processing device, the first set of digital image data generated from the modeled article arrangement at the first point in time at the first shipping point with the second set of digital image data of the second article arrangement at the second point in time at the destination point without any human intervention needed to compare the first set of digital image data and the second set of digital image date;

identifying a set of differences between the first set of digital image data and the second set of digital image data, the set of differences comprising at least one or more of a missing article, a reoriented article or damage to one or more articles to yield an identified set of differences between the first set of digital image data and the second set of digital image data; and determining potential tampering or damage of the first article arrangement on the first support surface by a fully autonomous mobile robot classifying the identified set of differences between the first set of digital image data and the second set of digital image data wherein the classification is selected from the group consisting of potential tampering or damage.

2. The method as defined in claim 1, wherein the second processing device utilizes image and shape recognition software to compare the first set of digital image data and the second set of digital image data.

3. The method as defined in claim 1, wherein the modeled article arrangement includes a particular predetermined control volume, the particular predetermined control volume being variable depending upon a type of support surface being utilized both with and without pallets.

4. The method as defined in claim 3, wherein at least one of the first support surface or the second support surface is a floor of a shipping container and the particular predetermined control volume is adjusted to provide maximum efficiency in modeling the first article arrangement and the second article arrangement on the floor of the shipping container both with and without pallets.

5. The method as defined in claim 3, wherein at least one of the first support surface or the second support surface is a floor of a trailer in use with a tractor trailer truck and the particular predetermined control volume is adjusted to provide maximum efficiency in modeling the first article arrangement and the second article arrangement on the floor of the trailer both with and without pallets.

6. The method as defined in claim 1, wherein similar articles are loaded onto the first support surface prior to dissimilar items while still achieving a stable modeling of articles.

7. The method as defined in claim 1, including encasing the first article arrangement and the second article arrangement in shrink-wrap and autonomously determining without any human intervention if the shrink-wrap has been tampered with.

8. The method as defined in claim 1, wherein both the first set of digital image data and the second set of digital image data further identify a particular type of each of the articles arranged on the first support surface with a particular article description or identifier.

* * * * *